United States Patent
Li et al.

(10) Patent No.: US 10,181,914 B2
(45) Date of Patent: Jan. 15, 2019

(54) DIGITAL PRE-DISTORTION CALIBRATION COEFFICIENT CONTROL METHOD AND APPARATUS

(71) Applicant: Huawei Technologies Co., Ltd., Shenzhen (CN)

(72) Inventors: Changliang Li, Xi'an (CN); Yanzhao Pang, Chengdu (CN); Xiaodong Li, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/636,261

(22) Filed: Jun. 28, 2017

(65) Prior Publication Data

US 2017/0302388 A1    Oct. 19, 2017

Related U.S. Application Data

(63) Continuation of application No. PCT/CN2014/095360, filed on Dec. 29, 2014.

(51) Int. Cl.
*H04B 17/13* (2015.01)
*H04L 25/03* (2006.01)
(Continued)

(52) U.S. Cl.
CPC ........... *H04B 17/13* (2015.01); *H03F 1/3258* (2013.01); *H03F 3/19* (2013.01); *H03F 3/245* (2013.01);
(Continued)

(58) Field of Classification Search
CPC . H04B 17/13; H04B 1/0475; H04B 2001/045
(Continued)

(56) References Cited

U.S. PATENT DOCUMENTS

| 7,602,244 B1 | 10/2009 | Holmes et al. |
| 2011/0075745 A1 | 3/2011 | Kleider et al. |

(Continued)

FOREIGN PATENT DOCUMENTS

| CN | 101022434 A | 8/2007 |
| CN | 103297214 A | 9/2013 |

(Continued)

OTHER PUBLICATIONS

Machine Translation and Abstract of Chinese Publication No. CN101022434, Aug. 22, 2007, 8 pages.

(Continued)

*Primary Examiner* — Michael Neff
(74) *Attorney, Agent, or Firm* — Conley Rose, P.C.

(57) ABSTRACT

A digital pre distortion (DPD) calibration coefficient control method and apparatus are applied to a microwave communications device that includes an analog device and a digital device, and can ensure a DPD calibration effect, where the method includes determining, by interpolation and according to DPD calibration coefficients corresponding to at least $2^N$ typical working states of the analog device obtained in advance, a specified DPD calibration coefficient corresponding to a specified working state of the analog device, where N is a quantity of parameters representing a working state of the analog device, and controlling a DPD calibration coefficient according to the determined specified DPD calibration coefficient corresponding to the specified working state of the analog device.

16 Claims, 4 Drawing Sheets

Determine, by means of interpolation and according to DPD calibration coefficients corresponding to at least $2^N$ typical working states of an analog module obtained in advance, a specified DPD calibration coefficient corresponding to a specified working state of the analog module — 201

Control a DPD calibration coefficient according to the determined specified DPD calibration coefficient corresponding to the specified working state of the analog module — 202

(51) Int. Cl.
  *H04B 1/04* (2006.01)
  *H03F 1/32* (2006.01)
  *H03F 3/19* (2006.01)
  *H03F 3/24* (2006.01)

(52) U.S. Cl.
  CPC ..... *H04B 1/0475* (2013.01); *H04L 25/03343* (2013.01); *H04B 2001/045* (2013.01)

(58) Field of Classification Search
  USPC .......................................................... 375/296
  See application file for complete search history.

(56) References Cited

U.S. PATENT DOCUMENTS

| | | | |
|---|---|---|---|
| 2011/0095819 A1 | 4/2011 | Velazquez | |
| 2012/0200435 A1* | 8/2012 | Ngo | H03M 7/3073 341/61 |
| 2013/0285748 A1* | 10/2013 | Hongo | H03F 1/0222 330/291 |
| 2014/0133531 A1 | 5/2014 | Nguyen et al. | |
| 2014/0292404 A1 | 10/2014 | Geng | |

FOREIGN PATENT DOCUMENTS

| | | |
|---|---|---|
| WO | 2011070497 A1 | 6/2011 |
| WO | 2014189897 A1 | 11/2014 |

OTHER PUBLICATIONS

Machine Translation and Abstract of Chinese Publication No. CN103297214, Sep. 11, 2013, 13 pages.
Guo, Y., et al., "Power Adaptive Digital Predistortion for RF Power Amplifiers," XP32615455, IEEE MTT-S International Microwave Symposium, Jun. 2014, 3 pages.
Xu, G., et al., "Digital Predistortion Linearization of Transmitters for Microwave Backhaul Systems," Journal of Microwaves, vol. 29, No. 2, Apr. 2013, 4 pages.
English Translation of Xu, G., et al., "Digital Predistortion Linearization of Transmitters for Microwave Backhaul Systems," Journal of Microwaves, vol. 29, No. 2, Apr. 2013, 7 pages.
Wu, Z., et al., "Study on Behavioral Model of Power Amplifiers Based on Polynomial Structures," 2009, 135 pages.
English Translation of Wu, Z., et al., "Study on Behavioral Model of Power Amplifiers Based on Polynomial Structures," 2009, 7 pages.
Foreign Communication From a Counterpart Application, European Application No. 14909321.3, Extended European Search Report dated Sep. 27, 2017, 10 pages.
Foreign Communication From a Counterpart Application, PCT Application No. PCT/CN2014/095360, English Translation of International Search Report dated Sep. 25, 2015, 2 pages.
Foreign Communication From a Counterpart Application, PCT Application No. PCT/CN2014/095360, English Translation of Written Opinion dated Sep. 25, 2015, 6 pages.

\* cited by examiner

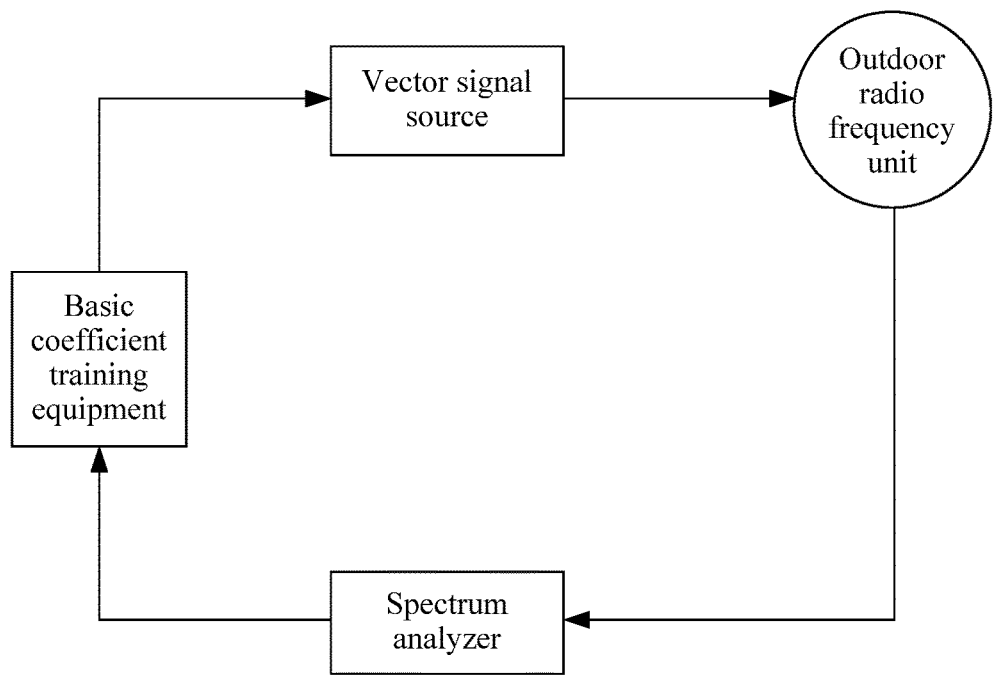

FIG. 1

Determine, by means of interpolation and according to DPD calibration coefficients corresponding to at least $2^N$ typical working states of an analog module obtained in advance, a specified DPD calibration coefficient corresponding to a specified working state of the analog module ⟶ 201

Control a DPD calibration coefficient according to the determined specified DPD calibration coefficient corresponding to the specified working state of the analog module ⟶ 202

FIG. 2

DIGITAL PRE-DISTORTION CALIBRATION COEFFICIENT CONTROL METHOD AND APPARATUS

CROSS-REFERENCE TO RELATED APPLICATION

This application is a continuation of International Patent Application No. PCT/CN2014/095360 filed on Dec. 29, 2014, which is hereby incorporated by reference in its entirety.

TECHNICAL FIELD

The present disclosure relates to the radio communications field, and in particular, to a digital pre-distortion (DPD) calibration coefficient control method and apparatus.

BACKGROUND

At present, a mainstream framework of a microwave communications device is a separated framework, that is, an analog part and a digital part of the device are separately located in two modules.

A digital module is configured to convert a signal received by the microwave communications device into a microwave digital signal, and output the microwave digital signal to an analog module after performing processing such as compensation on the signal.

The analog module is configured to convert, into a microwave analog signal, the microwave digital signal output by the analog module, and transmit the microwave analog signal after performing processing such as power amplification on the signal.

In order to reduce non-linear distortion of a power amplifier in the analog module, a DPD technology is generally used in the digital module to perform pre-calibration. That is, when a working state of the analog module changes, a DPD calibration coefficient in the digital module also needs to adaptively change at the same time in order to ensure a DPD calibration effect.

In the other approaches, a method for determining a DPD calibration coefficient is as follows. A DPD calibration coefficient corresponding to an extreme working state of an analog module is obtained in advance using an equipment and instrument environment shown in FIG. 1, and a DPD calibration coefficient corresponding to another working state of the analog module is calculated in a polynomial approximation manner. Details are as follows:

A function is preset:

$$y=f(x)=k1x+k2x^2+k3x^3+k4x^4+k5x^5+\ldots,$$

where y is a DPD calibration coefficient corresponding to a working state x of the analog module, and k1, k2, k3, k4, k5, and the like are coefficients of the function.

The coefficients k1, k2, k3, k4, k5, and the like are determined, using a function iteration algorithm, based on the DPD calibration coefficient corresponding to the extreme working state of the analog module and that is obtained in advance, that is, function y=f(x) is determined such that a DPD calibration coefficient corresponding to each working state of the analog module can be calculated.

When an output power represents a working state of the analog module, if an output power range of the analog module is [$P_{Min}$, $P_{Max}$], the output power $P_{Max}$ of the analog module indicates an extreme working state of the analog module. Therefore, a corresponding DPD calibration coefficient when an output power of the analog module is $P_{Max}$ may be obtained in advance, and a corresponding DPD calibration coefficient when an output power of the analog module is another value, that is, a DPD calibration coefficient corresponding to another working state of the analog module, is calculated in the foregoing polynomial approximation manner. However, the DPD calibration coefficient obtained in this manner has a relatively large error, and as a result, a calibration effect cannot be ensured.

SUMMARY

Embodiments of the present disclosure provide a DPD calibration coefficient control method and apparatus, and they can ensure a calibration effect.

According to a first aspect, a DPD calibration coefficient control method is provided, applied to a microwave communications device, where the microwave communications device includes an analog module and a digital module, and a DPD technology is used in the digital module, and the method includes determining, by means of interpolation and according to DPD calibration coefficients that are corresponding to at least $2^N$ typical working states of the analog module and that are obtained in advance, a specified DPD calibration coefficient corresponding to a specified working state of the analog module, where N is a quantity of parameters representing a working state of the analog module, and controlling a DPD calibration coefficient according to the determined specified DPD calibration coefficient corresponding to the specified working state of the analog module.

According to a second aspect, a DPD calibration coefficient control apparatus is provided, applied to a microwave communications device, where the microwave communications device includes an analog module and a digital module, and a DPD technology is used in the digital module, and the apparatus includes a processor and a memory, the processor is configured to perform a program, and the memory is configured to store the program. The program determines, by means of interpolation and according to DPD calibration coefficients corresponding to at least $2^N$ typical working states of the analog module obtained in advance, a specified DPD calibration coefficient corresponding to a specified working state of the analog module, where N is a quantity of parameters representing a working state of the analog module, and control a DPD calibration coefficient according to the determined specified DPD calibration coefficient corresponding to the specified working state of the analog module.

BRIEF DESCRIPTION OF DRAWINGS

The drawings are provided to facilitate further understanding of the present disclosure, and they constitute a part of the application. The drawings, along with the embodiments of the present disclosure, are used to explain the present disclosure, and pose no limitation on the present disclosure.

FIG. 1 is a schematic diagram of an equipment and instrument environment for obtaining a DPD calibration coefficient corresponding to a typical state of an analog module;

FIG. 2 is a schematic flowchart of a DPD calibration coefficient control method according to an embodiment of the present disclosure;

DESCRIPTION OF EMBODIMENTS

Figure 3:
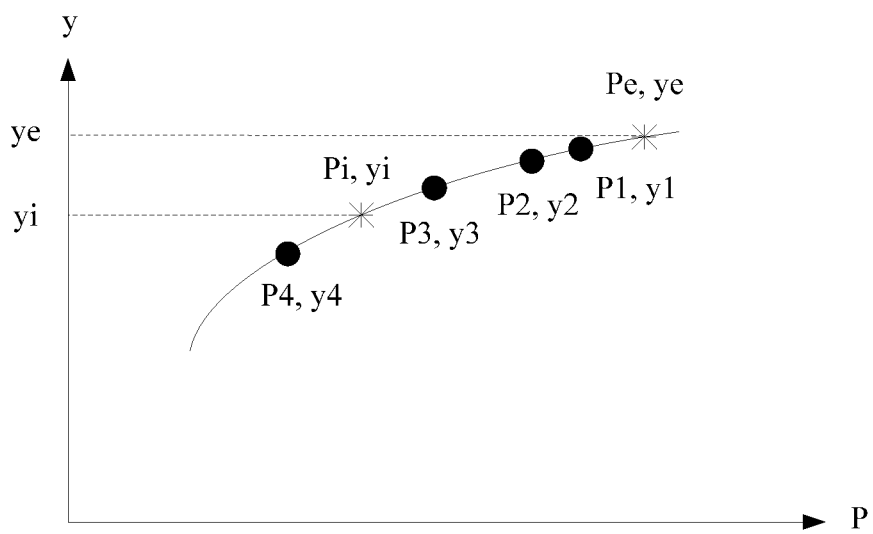
FIG. 3 is a first schematic diagram of a DPD calibration coefficient determining method according to an embodiment of the present disclosure.

In order to provide an implementation solution that ensures a DPD calibration effect, embodiments of the present disclosure provide a DPD calibration coefficient control method and apparatus. The following describes the embodiments of the present disclosure with reference to the accompanying drawings of the specification. It should be understood that, the embodiments described herein are used merely to describe and explain the present disclosure, but are not used to limit the present disclosure. In addition, the embodiments in this application and features in the embodiments may be mutually combined provided that no conflict is caused.

An embodiment of the present disclosure provides a DPD calibration coefficient control method, applied to a microwave communications device. The microwave communications device includes an analog module and a digital module, and a DPD technology is used in the digital module. The DPD calibration coefficient control method is shown in FIG. 2, and may include the following steps.

Step 201: Determine, by means of interpolation and according to DPD calibration coefficients corresponding to at least $2^N$ typical working states of the analog module obtained in advance, a specified DPD calibration coefficient corresponding to a specified working state of the analog module, where N is a quantity of parameters representing a working state of the analog module.

In addition, a parameter representing a typical working state is the same as a parameter representing the specified working state.

That is, when the quantity of parameters representing a working state of the analog module is 1, DPD calibration coefficients corresponding to at least two typical working states of the analog module need to be obtained in advance. When the quantity of parameters representing a working state of the analog module is 2, DPD calibration coefficients corresponding to at least four typical working states of the analog module need to be obtained in advance. When the quantity of parameters representing a working state of the analog module is 3, DPD calibration coefficients corresponding to at least eight typical working states of the analog module need to be obtained in advance. Other cases may be deduced by analogy, and examples are not given herein.

In this embodiment of the present disclosure, a parameter representing a working state of the analog module includes but is not limited to at least one of an output power, a working frequency, or a temperature.

Description of a working state of the analog module is more comprehensive and accurate as the quantity of parameters representing a working state of the analog module increases, and therefore a determined DPD calibration coefficient is more accurate. In actual implementation, a quantity and type of parameters representing a working state of the analog module may be selected according to a specific requirement of an actual application scenario on DPD calibration coefficient accuracy, a calculation speed, or the like.

Step 202: Control a DPD calibration coefficient according to the determined specified DPD calibration coefficient corresponding to the specified working state of the analog module.

Which working states of the analog module are considered as typical working states for which corresponding DPD calibration coefficients are obtained in advance may be determined based on an actual application scenario and according to experimental data.

Generally, the at least $2^N$ typical working states of the foregoing analog module include extreme working states of the analog module, that is, DPD calibration coefficients corresponding to the extreme working states of the analog module are obtained in advance.

For example, the at least $2^N$ typical working states of the foregoing analog module may further include an intermediate working state and more other working states of the analog module, to improve accuracy in subsequent calculation of the specified DPD calibration coefficient corresponding to the specified working state of the analog module.

The foregoing extreme working state is a working state when all parameters representing the working state of the analog module are of a maximum value or a minimum value, and the intermediate working state is a working state when all parameters representing the working state of the analog module are of an intermediate value.

For example, when a parameter representing a working state of the analog module is an output power, if an output power range of the analog module is $[P_{Min}, P_{Max}]$, the analog module has two extreme working states:

1. a working state when an output power of the analog module is $P_{min}$; and
2. a working state when an output power of the analog module is $P_{Max}$.

The intermediate working state of the analog module is a working state when an output power of the analog module is $(P_{Min}+P_{Max})/2$.

For another example, when parameters representing a working state of the analog module include an output power and a working frequency, if an output power range of the analog module is $[P_{min}, P_{max}]$, and a working frequency range of the analog module is $[f_{min}, f_{max}]$, the analog module has four extreme working states:

1. a working state when an output power and a working frequency of the analog module are respectively $P_{min}$ and $f_{min}$;
2. a working state when an output power and a working frequency of the analog module are respectively $P_{max}$ and $f_{max}$;
3. a working state when an output power and a working frequency of the analog module are respectively $P_{min}$ and $f_{max}$ and
4. a working state when an output power and a working frequency of the analog module are respectively $P_{max}$ and $f_{min}$.

The intermediate working state of the analog module is a working state when an output power and a working frequency of the analog module are respectively $(P_{min}+P_{max})/2$ and $(f_{min}+f_{max})/2$.

Further, there may be multiple implementation manners for obtaining a DPD calibration coefficient corresponding to a typical working state. For example, an equipment and instrument environment shown in FIG. 1 may be used, or remote closed-loop DPD in the prior art may be used, or another manner in the prior art is used, and examples are not described herein.

After the DPD calibration coefficients corresponding to the multiple typical working states of the analog module are obtained, the obtained data may be stored such that the specified DPD calibration coefficient corresponding to the specified working state of the analog module can be subsequently determined based on the obtained data by means of interpolation.

Interpolation is a method, in numerical analysis in the mathematics field, for estimating unknown data according to known disperse data. In this embodiment of the present disclosure, interpolation used in determining the specified DPD calibration coefficient may be internal interpolation or external interpolation, or may be linear interpolation or non-linear interpolation. Specific interpolation may be selected according to an actual situation and with reference to the DPD calibration coefficients that are corresponding to the typical working states of the analog module and that are obtained in advance.

When there is only one parameter representing a working state of the analog module, the specified DPD calibration coefficient corresponding to the specified working state can be determined by means of calculation for one time, and when there are multiple parameters representing a working state of the analog module, the specified DPD calibration coefficient corresponding to the specified working state needs to be determined by means of calculation for multiple times.

For example, when a parameter representing a working state of the analog module is an output power P, as shown in FIG. 3, a horizontal axis represents the output power P of the analog module, a vertical axis represents a DPD calibration coefficient y, "●" represents a typical working state, of the analog module, whose corresponding DPD calibration coefficient is obtained in advance, that is, when an output power of the analog module is P1, a corresponding DPD calibration coefficient is y1, when an output power of the analog module is P2, a corresponding DPD calibration coefficient is y2, when an output power of the analog module is P3, a corresponding DPD calibration coefficient is y3, and when an output power of the analog module is P4, a corresponding DPD calibration coefficient is y4, and "✳" represents a specified working state, of the analog module, whose corresponding DPD calibration coefficient needs to be determined.

A corresponding DPD calibration coefficient ye when an output power of the analog module is Pe may be determined by means of linear external interpolation and according to a corresponding DPD calibration coefficient y1 when an output power of the analog module is P1 and a corresponding DPD calibration coefficient y2 when an output power of the analog module is P2:

$$ye = y1 + Pe \times (y1-y2)/(P1-P2).$$

A corresponding DPD calibration coefficient yi when an output power of the analog module is Pi may be determined by means of linear internal interpolation and according to a corresponding DPD calibration coefficient y3 when an output power of the analog module is P3 and a corresponding DPD calibration coefficient y4 when an output power of the analog module is P4:

$$yi = y4 + Pi \times (y3-y4)/(P3-P4).$$

Figure 4:
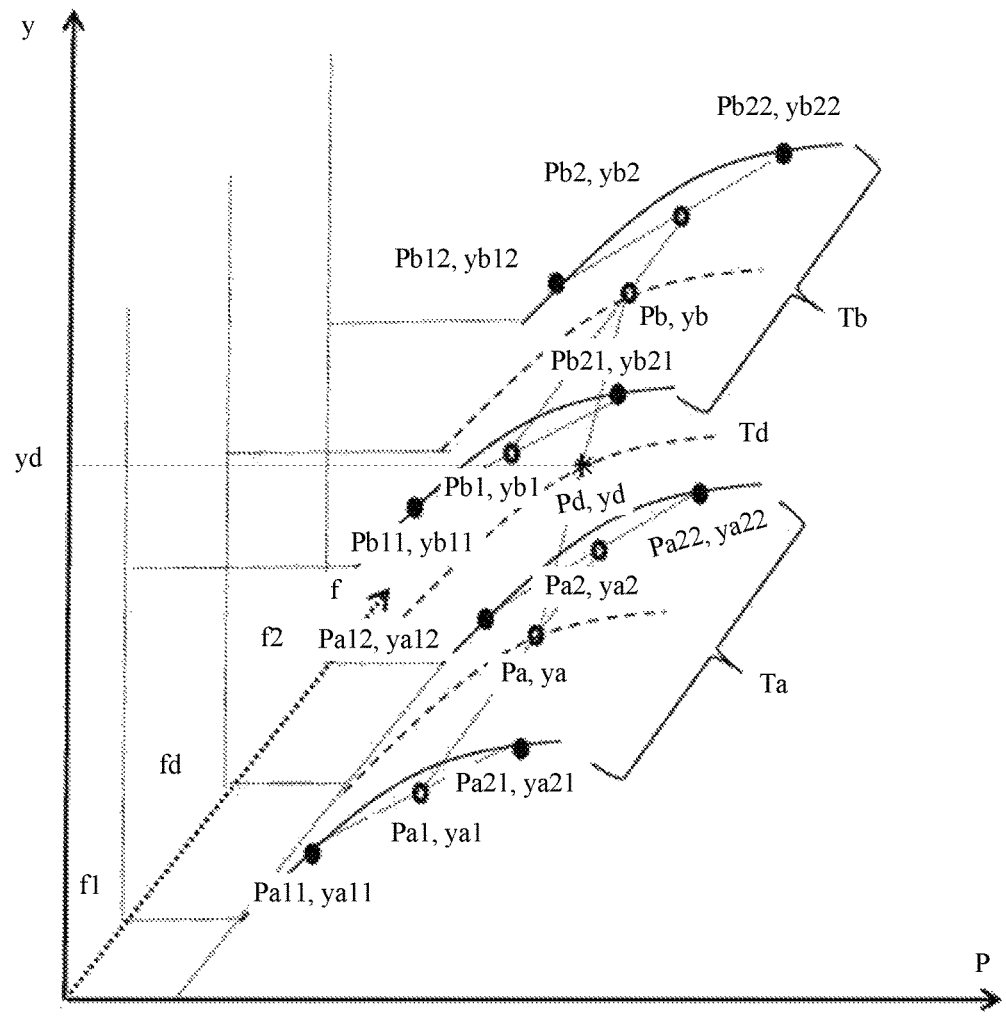
FIG. 4 is a second schematic diagram of a DPD calibration coefficient determining method according to an embodiment of the present disclosure.

For another example, when parameters representing a working state of the analog module include an output power P, a working frequency f, and a temperature T, as shown in FIG. 4, "●" represents eight extreme working states, of the analog module, whose corresponding DPD calibration coefficients are obtained in advance, that is, when an output power, a working frequency, and a temperature of the analog module are respectively Pa11, f1, and Ta, a corresponding DPD calibration coefficient is ya11, when an output power, a working frequency, and a temperature of the analog module are respectively Pa21, f1, and Ta, a corresponding DPD calibration coefficient is ya21, when an output power, a working frequency, and a temperature of the analog module are respectively Pa12, f2, and Ta, a corresponding DPD calibration coefficient is ya12, when an output power, a working frequency, and a temperature of the analog module are respectively Pa22, f2, and Ta, a corresponding DPD calibration coefficient is ya22, when an output power, a working frequency, and a temperature of the analog module are respectively Pb11, f1, and Tb, a corresponding DPD calibration coefficient is yb11, when an output power, a working frequency, and a temperature of the analog module are respectively Pb21, f1, and Tb, a corresponding DPD calibration coefficient is yb21, when an output power, a working frequency, and a temperature of the analog module are respectively Pb12, f2, and Tb, a corresponding DPD calibration coefficient is yb12, and when an output power, a working frequency, and a temperature of the analog module are respectively Pb22, f2, and Tb, a corresponding DPD calibration coefficient is yb22, "✳" represents a specified working state, of the analog module, whose corresponding DPD calibration coefficient needs to be determined, and "○" represents a working state involved in an interpolation calculation process.

For ease of description, it is assumed that a corresponding DPD calibration coefficient when an output power, a working frequency, and a temperature of the analog module are respectively Pd, fd, and Td can be determined by performing only intermediate value calculation.

During specific calculation, a corresponding DPD calibration coefficient ya1 when an output power, a working frequency, and a temperature of the analog module are respectively Pa1, f1, and Ta and a corresponding DPD calibration coefficient ya2 when an output power, a working frequency, and a temperature of the analog module are respectively Pa2, f2, and Ta may be first calculated, and then, a corresponding DPD calibration coefficient ya when an output power, a working frequency, and a temperature of the analog module are respectively Pa, fd, and Ta is calculated:

$$ya1 = (ya11 + ya21)/2;$$

$$ya2 = (ya12 + ya22)/2; \text{ and}$$

$$ya = (ya1 + ya2)/2.$$

Afterward, a corresponding DPD calibration coefficient yb1 when an output power, a working frequency, and a temperature of the analog module are respectively Pb1, f1, and Tb and a corresponding DPD calibration coefficient yb2 when an output power, a working frequency, and a temperature of the analog module are respectively Pb2, f2, and Tb are calculated, and then, a corresponding DPD calibration coefficient yb when an output power, a working frequency, and a temperature of the analog module are respectively Pb, fd, and Tb is calculated:

$$yb1 = (yb11 + yb21)/2;$$

$yb2=(yb12+yb22)/2$; and $yb=(yb1+yb2)/2$.

Finally, a corresponding DPD calibration coefficient yd when an output power, a working frequency, and a temperature of the analog module are respectively Pd, fd, and Td is calculated:

$yd=(ya+yb)/2$.

Figure 5:
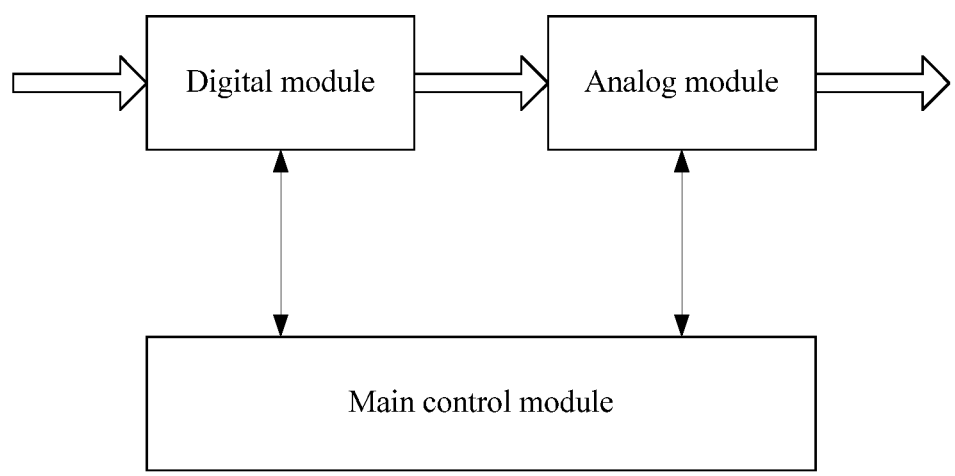
FIG. 5 is a schematic diagram of a synchronous adjustment solution according to an embodiment of the present disclosure.

In actual implementation, the foregoing process of determining a DPD calibration coefficient may be but is not limited to being performed by a main control module in the existing microwave communications device. The main control module controls a DPD calibration coefficient of the digital module according to the determined specified DPD calibration coefficient, as shown in FIG. 5.

Further, the specified DPD calibration coefficient determined in step 201 may be a DPD calibration coefficient corresponding to a current working state of the analog module. Alternatively, when the main control module pre-adjusts a working state of the analog module, the determined specified DPD calibration coefficient may be a DPD calibration coefficient corresponding to a target working state of the analog module.

When the specified DPD calibration coefficient determined in step 201 corresponding to the specified working state of the analog module is a specified DPD calibration coefficient corresponding to the current working state of the analog module, controlling a DPD calibration coefficient according to the determined specified DPD calibration coefficient corresponding to the specified working state of the analog module includes controlling a current DPD calibration coefficient according to the determined specified DPD calibration coefficient corresponding to the current working state of the analog module. That is, when the current DPD calibration coefficient is not equal to the determined specified DPD calibration coefficient, the current DPD calibration coefficient is adjusted, and the current DPD calibration coefficient is adjusted to the determined specified DPD calibration coefficient, or when the current DPD calibration coefficient is equal to the determined specified DPD calibration coefficient, the current DPD calibration coefficient does not need to be adjusted.

When the specified DPD calibration coefficient determined in step 201 corresponding to the specified working state of the analog module is a specified DPD calibration coefficient corresponding to the target working state of the analog module, controlling a DPD calibration coefficient according to the determined specified DPD calibration coefficient corresponding to the specified working state of the analog module includes controlling a current DPD calibration coefficient to be adjusted, starting from a specified moment in order to the determined specified DPD calibration coefficient, where the specified moment is a moment starting from which a current working state of the analog module is controlled to be adjusted to the target working state. Further, the main control module may send a state adjustment instruction to the analog module and send a coefficient adjustment instruction to the digital module, where the state adjustment instruction instructs the analog module to adjust, starting from the specified moment, the current working state to the target working state, and the coefficient adjustment instruction instructs the digital module to adjust, starting from the specified moment, the current DPD calibration coefficient to the specified DPD calibration coefficient. That is, no direction communication is established between the analog module and the digital module, and working state adjustment of the analog module and DPD calibration coefficient adjustment of the digital module are started simultaneously by means of timestamp pseudo-synchronization.

Adjustment frequency, state adjustment step amplitude, and coefficient adjustment step amplitude may be preset, to avoid impact of a sudden change on the device. After starting working state adjustment at the specified moment, the analog module adjusts gradually the current working state to the target working state according to the preset adjustment frequency and state adjustment step amplitude, and after starting DPD calibration coefficient adjustment at the specified moment, the digital module adjusts gradually the current DPD calibration coefficient to the specified DPD calibration coefficient according to the preset adjustment frequency and coefficient adjustment step amplitude.

When multiple parameters representing a working state in the target working state of the analog module are all adjusted relative to the current working state, the analog module may adjust the multiple parameters one by one when adjusting the current working state to the target working state.

It should be noted that, when multiple parameters such as a temperature represent a working state of the analog module, the temperature is generally not adjusted because of uncontrollability of the temperature, that is, a temperature in the target working state of analog module is generally unchanged relative to the current working state.

For example, both the analog module and the digital module return a response message to the main control module after completing their respective adjustment actions in order to notify an adjustment result.

For example, after a working state of the analog module is adjusted to the target working state using a timestamp, if a current working state of the analog module is not the target working state, adjustment of the working state of the analog module may continue, until the working state becomes the target working state.

It can be learned that, compared with a calibration coefficient determined using the other approaches, a calibration coefficient determined using the DPD calibration coefficient control method provided in this embodiment of the present disclosure has higher accuracy, is easier to implement, and has a higher match rate when a working state of an analog module needs to be adjusted and synchronous adjustment of the working state of the analog module and a DPD calibration coefficient is implemented using a timestamp. This can ensure a DPD calibration effect, thereby ensuring performance of a microwave communications device and reducing power consumption of the microwave communications device.

Figure 6:
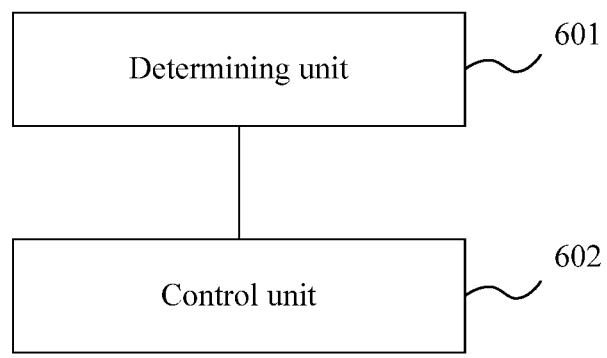
FIG. 6 is a schematic structural diagram of a DPD calibration coefficient control apparatus according to an embodiment of the present disclosure.

Based on the same inventive concept and according to the DPD calibration coefficient control method provided in the foregoing embodiment of the present disclosure, correspondingly, an embodiment of the present invent further provides a DPD calibration coefficient control apparatus, applied to a microwave communications device. The microwave communications device includes an analog module and a digital module, and a DPD technology is used in the digital module. A schematic structural diagram of the control apparatus is shown in FIG. 6, and the control apparatus includes a determining unit 601 configured to determine, by means of interpolation and according to DPD calibration coefficients corresponding to at least $2^N$ typical working states of the analog module obtained in advance, a specified DPD calibration coefficient corresponding to a specified working state of the analog module, where N is a quantity of parameters representing a working state of the analog module, and a control unit 602 configured to control a DPD calibration coefficient according to the determined specified DPD calibration coefficient corresponding to the specified working state of the analog module.

For example, the at least $2^N$ typical working states of the analog module include extreme working states of the analog module, and the extreme working state is a working state when all parameters representing the working state of the analog module are of a maximum value or a minimum value.

In this embodiment of the present disclosure, a parameter representing a working state of the analog module includes at least one of an output power, a working frequency, or a temperature.

The determining unit 601 is further configured to determine a specified DPD calibration coefficient corresponding to a target working state of the analog module, and the control unit 602 is further configured to control a current DPD calibration coefficient to be adjusted, starting from a specified moment, to the determined specified DPD calibration coefficient, where the specified moment is a moment starting from which a current working state of the analog module is controlled to be adjusted to the target working state.

The determining unit 601 is further configured to determine a specified DPD calibration coefficient corresponding to a current working state of the analog module, and the control unit 602 is further configured to control a current DPD calibration coefficient according to the determined specified DPD calibration coefficient corresponding to the current working state of the analog module.

Functions of the units in the foregoing apparatus may be corresponding to the corresponding steps shown in FIG. 2, and are not described herein.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a compact disc read-only memory (CD-ROM), an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device such that a series of operations and steps are performed on the computer or the other programmable device, thereby generating computer-implemented processing. Therefore, the instructions executed on the computer or the other programmable device provide steps for implementing a specific function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover the embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A digital pre distortion (DPD) calibration coefficient control method, applied to a microwave communications device, the microwave communications device comprising an analog device and a digital device, a DPD technology being used in the digital device, and the method comprising:
acquiring a specified DPD calibration coefficient corresponding to a specified working state of the analog device, the specified DPD calibration coefficient being based on interpolation and according to DPD calibration coefficients corresponding to at least $2^N$ working states of the analog device obtained in advance, N being a quantity of parameters representing a working state of the analog device, the at least $2^N$ working states of the analog device comprising extreme working states of the analog device, and an extreme working state being a working state when all parameters representing the working state of the analog device are a maximum value; and
controlling a DPD calibration coefficient according to the determined specified DPD calibration coefficient corresponding to the specified working state of the analog device.

2. The method of claim 1, wherein a parameter representing the working state of the analog device comprises at least one of an output power, a working frequency, or a temperature.

3. The method of claim 1, wherein determining the specified DPD calibration coefficient corresponding to the specified working state of the analog device comprises determining a specified DPD calibration coefficient corresponding to a target working state of the analog device, the DPD calibration coefficient being controlled by controlling a current DPD calibration coefficient to be adjusted, starting from a specified moment to the determined specified DPD calibration coefficient, and the specified moment being a moment starting from which a current working state of the analog device is controlled to be adjusted to the target working state.

4. The method of claim 1, wherein determining the specified DPD calibration coefficient corresponding to the specified working state of the analog device comprises determining a specified DPD calibration coefficient corresponding to a current working state of the analog device, and the DPD calibration coefficient being controlled by controlling a current DPD calibration coefficient according to the determined specified DPD calibration coefficient corresponding to the current working state of the analog device.

5. A digital pre-distortion (DPD) calibration coefficient control method, applied to a microwave communications device, the microwave communications device comprising an analog device and a digital device, a DPD technology being used in the digital device, and the method comprising;
acquiring a specified DPD calibration coefficient corresponding to a specified working state of the analog device, the specified DPD calibration coefficient being based on interpolation and according to DPD calibration coefficients corresponding to at least $2^N$ working states of the analog device obtained in advance, N being a quantity of parameters representing a working state of the analog device, the at least $2^N$ working states of the analog device comprising extreme working states of the analog device, and an extreme working state being a working state when all parameters representing the working state of the analog device are a minimum value; and
controlling a DPD calibration coefficient according to the determined specified DPD calibration coefficient corresponding to the specified working state of the analog device.

6. The method of claim 5, wherein a parameter representing the working state of the analog device comprises at least one of an output power, a working frequency, or a temperature.

7. A digital pre distortion (DPD) calibration coefficient control apparatus, applied to a microwave communications device, the microwave communications device comprising an analog device and a digital device, a DPD technology being used in the digital device, and the apparatus comprising:
a memory configured to store a program; and
a processor coupled to the memory, the program causing the processor to be configured to:
determine, by interpolation and according to DPD calibration coefficients corresponding to at least $2^N$ working states of the analog device obtained in advance, a specified DPD calibration coefficient corresponding to a specified working state of the analog device, N being a quantity of parameters representing a working state of the analog device, the at least $2^N$ working states of the analog device comprising extreme working states of the analog device, and an extreme working state being a working state when all parameters representing the working state of the analog device are a maximum value; and
control a DPD calibration coefficient according to the determined specified DPD calibration coefficient corresponding to the specified working state of the analog device.

8. The apparatus of claim 7, wherein a parameter representing the working state of the analog device comprises at least one of an output power, a working frequency, or a temperature.

9. The apparatus of claim 7, wherein the program further causes the processor to be configured to:
determine a specified DPD calibration coefficient corresponding to a target working state of the analog device; and
control a current DPD calibration coefficient to be adjusted, starting from a specified moment, to the determined specified DPD calibration coefficient, the specified moment being a moment starting from which a current working state of the analog device is controlled to be adjusted to the target working state.

10. The apparatus of claim 7, wherein the program further causes the processor to be configured to:
determine a specified DPD calibration coefficient corresponding to a current working state of the analog device; and
control a current DPD calibration coefficient according to the determined specified DPD calibration coefficient corresponding to the current working state of the analog device.

11. A digital pre-distortion (DPD ) calibration coefficient control apparatus, applied to a microwave communications device, the microwave communications device comprising an analog device and a digital device, a DPD technology being used in the digital device, and the apparatus comprising:
a memory configured to store a program; and
a processor coupled to the memory, the program causing the processor to be configured to:
determine, by interpolation and according to DPD calibration coefficients corresponding to at least $2^N$ working states of the analog device obtained in advance, a specified DPD calibration coefficient corresponding to a specified working state of the analog device, N being a quantity of parameters representing a working state of the analog device, the at least $2^N$ working states of the analog device comprising extreme working states of the analog device, and an extreme working state being a working state when all parameters representing the working state of the analog device are a minimum value; and
control a DPD calibration coefficient according to the determined specified DPD calibration coefficient corresponding to the specified working state of the analog device.

12. The apparatus of claim 11, wherein a parameter representing the working state of the analog device comprises at least one of an output power, a working frequency, or a temperature.

13. A computer program product comprising a non-transitory computer readable storage medium storing program code thereon for digital pre-distortion (DPD) calibration coefficient control, applied to a microwave communications device, the microwave communications device comprising an analog device and a digital device, a DPD technology being used in the digital device, and the program code comprising instructions for executing a method that comprises:
determining, by interpolation and according to DPD calibration coefficients corresponding to at least $2^N$ working states of the analog device obtained in advance, a specified DPD calibration coefficient corresponding to a specified working state of the analog device, N being a quantity of parameters representing a working state of the analog device, the at least $2^N$ working states of the analog device comprising extreme working states of the analog device, and an extreme working state being a working state when all parameters representing the working state of the analog, device are of a maximum or a minimum value; and controlling a DPD calibration coefficient according to the determined specified DPD calibration coefficient corresponding to the specified working state of the analog device.

14. The computer program product of claim 13, wherein a parameter representing the working state of the analog device comprises at least one of an output power, a working frequency, or a temperature.

15. The computer program product of claim 13, wherein determining the specified DPD calibration coefficient corresponding to the specified working state of the analog device comprises determining a specified DPD calibration coefficient corresponding to a target working state of the analog device, the DPD calibration coefficient being controlled by controlling a current DPD calibration coefficient to be adjusted, starting from a specified moment to the determined specified DPD calibration coefficient, and the specified moment being a moment starting from which a current working state of the analog device is controlled to be adjusted to the target working state.

16. The computer program product of claim 13, wherein determining the specified DPD calibration coefficient corresponding to the specified working state of the analog device comprises determining a specified DPD calibration coefficient corresponding to a current working state of the analog device, and the DPD calibration coefficient is controlled by controlling a current DPD calibration coefficient according to the determined specified DPD calibration coefficient corresponding to the current working state of the analog device.

* * * * *

UNITED STATES PATENT AND TRADEMARK OFFICE
CERTIFICATE OF CORRECTION

PATENT NO. : 10,181,914 B2
APPLICATION NO. : 15/636261
DATED : January 15, 2019
INVENTOR(S) : Changliang Li, Yanzhao Pang and Xiaodong Li Page 1 of 1

It is certified that error appears in the above-identified patent and that said Letters Patent is hereby corrected as shown below:

In the Claims

Column 11, Line 36: "pre distortion" should read "pre-distortion"

Signed and Sealed this
Fifth Day of March, 2019

Andrei Iancu
*Director of the United States Patent and Trademark Office*